(12) United States Patent
Cadic et al.

(10) Patent No.: US 7,392,455 B2
(45) Date of Patent: Jun. 24, 2008

(54) ERROR CORRECTION CODING METHOD USING AT LEAST TWICE A SAME ELEMENTARY CODE, CODING METHOD, CORRESPONDING CODING AND DECODING DEVICES

(75) Inventors: Emmanuel Cadic, Rennes (FR); Jean-Claude Carlac'H, Rennes (FR)

(73) Assignee: France Telecom, Paris (FR)

( * ) Notice: Subject to any disclaimer, the term of this patent is extended or adjusted under 35 U.S.C. 154(b) by 221 days.

(21) Appl. No.: 10/811,487

(22) Filed: Mar. 26, 2004

(65) Prior Publication Data

US 2005/0210363 A1 Sep. 22, 2005

(30) Foreign Application Priority Data

Mar. 31, 2003 (FR) .................................. 03 03989

(51) Int. Cl.
*H03M 13/03* (2006.01)
(52) U.S. Cl. ..................................................... 714/755
(58) Field of Classification Search ................ 714/752, 714/786; *H03M 13/03*
See application file for complete search history.

(56) References Cited

U.S. PATENT DOCUMENTS 4,295,218 A 10/1981 Tanner ......................... 371/40

7,027,521 B2 * 4/2006 Gueguen .................... 714/786
2004/0054954 A1 * 3/2004 Adde et al. ................. 714/755
2005/0204271 A1 * 9/2005 Sharon et al. ............... 714/801

FOREIGN PATENT DOCUMENTS

EP 1158682 A2 * 11/2001
EP 1317070 A1 * 6/2003

OTHER PUBLICATIONS

Tanner, Robert Michael; Minimum-Distance Bounds by Graph Analysis; Feb. 2001; IEEE Transactions on Information Theory, vol. 47, No. 2; pp. 808-821.*
Joachim Hagenauer, Rate-Compatible Punctured Convolutional Codes (RCPC Codes) and their Applications, Apr. 1988, vol. 36, No. 4, pp. 389-400.

* cited by examiner

*Primary Examiner*—Jacques Louis-Jacques
*Assistant Examiner*—Sam Rizk
(74) *Attorney, Agent, or Firm*—Westman, Champlin & Kelly, P.A.

(57) ABSTRACT

The invention relates to an error correction coding method, using at least two distinct sections of a predetermined elementary code, associating an arrival vector ($s_2$, $s_3$) with a starting state vector ($s_0$, $s_1$), according to a vector of branch labels ($b_0$, $b_1$, $b_2$, $b_3$), defining a code word, two sections of said elementary code being distinct when the order and/or the role of the elements of said branch label vector are changed.

26 Claims, 6 Drawing Sheets

ERROR CORRECTION CODING METHOD USING AT LEAST TWICE A SAME ELEMENTARY CODE, CODING METHOD, CORRESPONDING CODING AND DECODING DEVICES

FIELD OF THE INVENTION

The field of the invention is that of digital communications. More specifically, the invention relates to error-correcting codes. The invention notably, but not exclusively, relates to codes known as "turbo-codes".

BACKGROUND OF THE INVENTION

The invention may find applications in all fields where it is required or at least desirable that an error-correcting code be available. Thus, the invention may be applied for example, to:
- protection against errors due to noises and interferences inherent in physical transmission channels (conventional error correction coding and space-time codes for multi-antenna systems);
- compression of signals from information sources: images, sounds, signals, and data;
- protection against errors for storage of data mass memories, such as computer disks or microprocessors.

A large number of coding techniques for correcting errors are already known. First studies on the subject go back to the 1940s. It was at that time that Shannon founded the theory of information which is still used presently. A large number of coding families were proposed later.

Convolutive codes are thus known (which may notably apply trellis coding, according to the Viterbi algorithm), or even the coding scheme currently designated as "turbo-code", proposed in 1993 by C. Berrou and A. Glavieux, for example in the article "Near Shannon Limit Error-Correcting Coding and Decoding: Turbo-codes" (proofreadings of the ICC'93, May 1993, 1064-1070).

This technique was the subject of many studies and improvements.

The family of codes known as LDPC codes is also known.

Turbo-codes and LDPC codes and more generally all concatenated codes provide performances in terms of correction which are remarkable for large block sizes and notably for blocks of at least a few thousands or tens of thousands of information bits.

Unfortunately, the handling of such blocks of information bits represents great computing complexity upon decoding, which practically proves to be only compatible with high computing power microprocessors which accordingly prove to be relatively costly.

Moreover, these structures on the other hand are not very effective in correcting errors for blocks with small sizes, of the order of one hundred or one thousand bits, for example.

However, there is a very strong demand for small packet communications presently in the field of digital communications, which assumes application of codes with small lengths.

The aim of the invention is notably to provide a solution to this need and to overcome the drawbacks of prior techniques.

More specifically, it is an aim of the invention to provide an error correction coding technique, notably of the "turbo-code" type, for reducing the complexity of decoding.

In other words, the aim of the invention is to provide such a coding technique for producing a simplified decoder and therefore at a reduced cost, without naturally degrading the quality of the error correction.

It is another aim of the invention to provide such a coding technique which is well adapted to error correction for blocks of small sizes.

In other words, another aim of the invention is to provide such a technique providing proper minimum distances in spite of small block sizes.

Still another aim of the invention is to provide such a technique for producing coding and decoding in a simple way, and which accordingly may be easily applied.

SUMMARY OF THE INVENTION

These and also other objects which will appear more clearly later on, are achieved by an error correction coding method, according to which at least two distinct sections of a predetermined elementary code are used, associating an arrival vector (s2, s3), with a starting state vector (s0, s1) according to a vector of branch labels (b0, b1, b2, b3), defining a code word, both sections of said elementary code being distinct when the order and/or the role of the elements of said vector of branch labels are changed.

A code thus formed is very simple, as it is formed from basic bricks of very low complexity and very small size (which optionally may be produced as wired analog circuits), and still very effective. As it will be seen later on, codes known per se may notably be reproduced but in a very simplified form.

More specifically, with the invention, a reduction of the complexity by a ratio of at least 2 (notably by using trellises with a small number of states, in this case a minimum of 4 for binary codes as explained later on) relatively to the existing state of the art, may be obtained for a same correction capacity.

In addition, these binary codes with small lengths built with these trellises may have excellent minimum distances, hence a capacity of correcting more errors than the present "turbo-codes" in spite of small block sizes and trellises with only 4 states in the binary case.

Preferentially, the code words of said elementary code have undergone partitioning into four packets (s0, s1), (s2, s3), (b0, b1), (b2, b3) so that each code word, except the zero code word, comprises at least three lit packets out of four, a packet is said to be lit when it comprises at least a bit of value 1.

This allows "1"s to be propagated and hence the code distance to be increased.

Advantageously, said elementary code sections are associated in sequence in order to form at least one coding trellis. The error correction capacity may be optimized by a fortunate choice of stage sequences (sections) forming this trellis.

According to an advantageous embodiment, said trellis or trellises are cyclic.

This enables optimization of the correction capacities and uniformization of the protection level between the information bits.

In this case, the advantageously retained coding result is the one which has an arrival state identical with its starting state, among all the possible starting states for one of said elementary code sections, selected as starting section.

Advantageously, the coding method of the invention comprises two trellises, wherein the source data to be coded are entered in different orders.

According to a preferred embodiment, said coding result is the whole of the information and redundancy elements delivered by said trellis or trellises.

Puncturing may be applied on said elements forming the coding result, advantageously.

Also, puncturing of at least of said sections may be provided according to a particular aspect of the invention. Preferably, at least one left punctured section and at least one right punctured section are used.

According to a preferred embodiment of the invention, said trellis or trellises are at least duplicated once, in order to have at least two coding sets interconnected via permutation means.

In this case, the data to be coded may advantageously be transmitted to each of said coding sets, preferably with a shift.

According to a first approach of the invention, said vectors consist of binary elements. In this case, said elementary code advantageously is a [8,4,4] Hamming code.

The coding method may apply in this case, the following sections:

$H; (y_0, y_1, x_0, x_1) \rightarrow (b_0, b_1, b_2, b_3)$
$H; (x_0, x_1, y_0, y_1) \rightarrow (b_0, b_1, b_2, b_3)$
$H; (x_0, y_0, y_1, x_1) \rightarrow (b_0, b_1, b_2, b_3)$
$H; (y_0, x_0, x_1, y_1) \rightarrow (b_0, b_1, b_2, b_3)$
$H; (y_0, x_0, y_1, x_1) \rightarrow (b_0, b_1, b_2, b_3)$
$H; (x_0, y_0, x_1, y_1) \rightarrow (b_0, b_1, b_2, b_3)$ Advantageously, the following punctured sections are additionally used:

$H^g; (*,*, x_0, x_1) \rightarrow (*,*, b_2, b_3)$
$H^d; (x_0, x_1, *, *) \rightarrow (b_0, b_1, *, *)$ According to a particular embodiment, the coding comprises three coding sets each receiving 12 coding bits via an identity permutation, a 4 bit cyclic shift permutation and an 8 bit cyclic shift permutation, respectively.

In this case, said coding tests are advantageously arranged so as to produce a [24,12,8] Golay code.

According to another advantageous approach, said vectors consist of basic words which may assume 4 values. In this case, said elementary code advantageously is a Nordstrom-Robinson code with parameters [8,4,6].

According to still another advantageous approach to the invention, said vectors consist of basic words which may assume 8 values. Then, said elementary code may notably be an M[8,4] code.

According to a preferred aspect of the invention, the code thereby obtained is of the "turbo-code" type.

The invention also relates to error correction coding devices applying such a coding method.

The invention further relates to corresponding decoding devices and methods.

Such a method applies steps which are symmetrical to the ones applied in the coding. Thus, at least two distinct sections of a predetermined elementary code are used, associating an arrival vector (s2, s3), with a starting state vector (s0, s1), according to a branch label vector (b0, b1, b2, b3), two sections of said elementary code being distinct when the order and/or the role of the elements of said branch label vector are changed.

Preferably, said decoding method is iterative.

Advantageously, at every iteration, a posteriori probabilities are calculated on metrics associated with at least one trellis defined by said elementary code sections, and said iterations are interrupted when a stable result is obtained and/or after a predetermined number of iterations.

BRIEF DESCRIPTION OF THE DRAWINGS

Other features and advantages of the invention will become apparent upon reading the following description of embodiments of the invention, given by way of simple illustrative and non-limiting examples and appended figures among which.

DETAILED DESCRIPTION OF THE PREFERRED EMBODIMENTS

Figure 1:
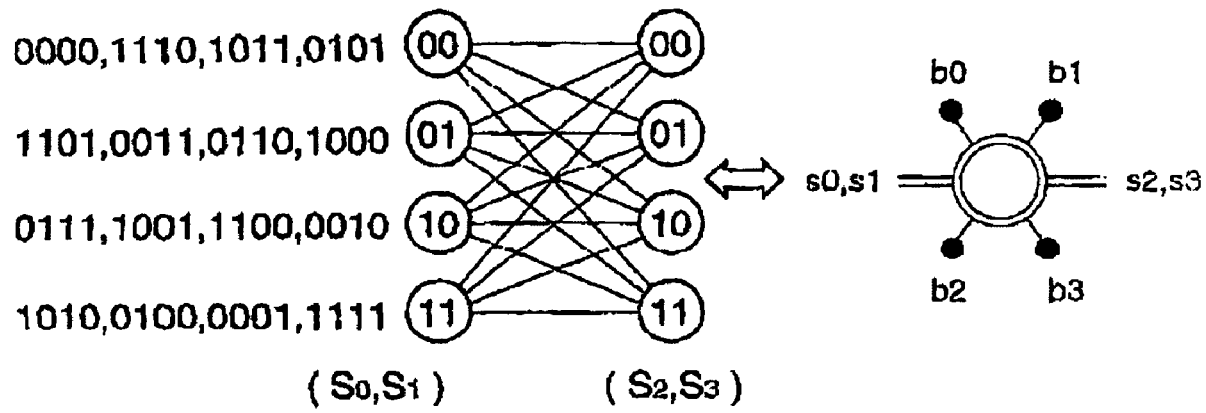
FIG. 1 shows the basic section of an elementary code used according to a first embodiment of the invention, and the corresponding Tanner graph.

1) General Principles of the Invention:

As already mentioned, the object of the invention is to provide codes, notably "turbo-codes", with less decoding complexity as compared with known techniques, while guaranteeing good error correction capabilities, even for small block sizes.

As it will be seen later on, a reduction of the complexity by a ratio at least equal to 2, may be obtained with the invention, notably by using trellises with a small number of states (in this case, a minimum of 4 states for the binary codes) as compared with known techniques, for a same correction capability.

Moreover, codes with small lengths built with these trellises have excellent minimum distances, hence a capability for correcting more errors than the present "turbo-codes", in spite of the small size of the block and the trellises.

In the case of binary codes, an important technical element of the invention is the use of 4 state trellis stages derived from a basic section. In the embodiment described later on (in the paragraph labeled "2) state basic sections . . . "), this section is called "H", and represents the extended Hamming code with parameters [8,4,4].

The simplicity and performance of the turbo-codes obtained according to the invention result from the fact that this small code is unique and that it has a length of 8 bits, for 4 bits of useful information, and a minimum distance between the code words equal to 4.

The trellis sections or stages are derived from the basic section, by changing the order and the role (input or output) of the branch label bits.

Another important aspect is that the small basic codes taken for building basic stages are partitioned, according to a non-trivial approach, into 4 packets of bits, the partition being such that all the non-zero codes words always have at least 3 non-zero packets out of 4, i.e., they have at least 1 non-zero bit per packet. It is stated later on that there are always at least 3 "lit" packets out of 4, a packet being lit when at least 1 bit is non-zero.

In the aforementioned case of the {8,4,4} Hamming code, the four packets consist of 2 bits.

According to the invention, each trellis is therefore seen as a sequence of different (or not) stages derived from a basic section. A fortunate choice of these sequences provides optimization of the error correction capacity.

Preferentially, the thereby obtained trellises are cyclic (or "tail-biting"), which provides optimization of error correction capacities and uniformization of the protection level between the information bits.

For codes on ring Z4 (which is the set {0, 1, 2, 3} provided with modulo 4 addition and multiplication), an equivalent code or a Nordstrom-Robinson code with parameters {8,4,6} may notably be used with the Lee distance (see the paragraph labeled "3) state basic trellis . . . ").

16 state trellises are then obtained.

Also, codes may be produced on Z8 and Z16, by using two other small performing codes, in order to obtain stages with 64 and 256 states respectively (see the paragraph labeled "4) 64 state basic . . . ").

With these codes on Z4 (Z8, respectively), extremely performing MDP4 (4 point phase modulation) (MDP8, MDP16 or MAQ16 (16 point quadrature amplitude modulation), respectively)) coded modulations may notably be built.

On Z4, they may thereby, with low complexity, be extended to MDP16 or MAQ16 coded modulations. Likewise, in set Z8, they may be extended to a MAQ64 modulation.

Indeed, a MDP4 modulation may be broken down into two MDP2 modulations, or a MAQ16 modulation into two MDP4 modulations, a MAQ32 modulation into a product of a MAQ8 modulation and a MDP4 modulation, a MAQ64 modulation into two MDP8 modulations, or even a MAQ256 modulation into two MDP16 modulations . . .

Trellises produced on Z4 or Z8 are therefore proper basic bricks, with low complexities, for building coder/modulators at reduced cost, with very high performances, and are more easily decoded.

2) State Basic Sections for Binary "Turbo-codes"

a) State Non-Punctured Basic Trellis Sections for Binary "Turbo-codes"

The basic trellis "H" section describes the words of the [8,4,4] Hamming codes which has as generating matrix $G_H$ such as:

$$G_H = [1_4 P] = \begin{bmatrix} 1 & 0 & 0 & 0 & 0 & 1 & 1 & 1 \\ 0 & 1 & 0 & 0 & 1 & 1 & 0 & 1 \\ 0 & 0 & 1 & 0 & 1 & 0 & 1 & 1 \\ 0 & 0 & 0 & 1 & 1 & 1 & 1 & 0 \end{bmatrix}$$

Section H, illustrated by FIG. 1, represents the set of code words of the [8,4,4] Hamming codes as a set of paths from starting states ($s_0$, $s_1$) to arrival states ($S_2$, $s_3$) via label branches ($b_0$, $b_1$, $b_2$, $b_3$).

The state and label vectors are related through the matrix equation:

$$(s_0, s_1, s_2, s_3) = (b_0, b_1, b_2, b_3) P.$$

The labels are listed in a standard way: opposite each starting state and in the order 00,01,10,11 of the associated arrival states. The Tanner graph of this section is illustrated on the right of the section.

The [8,4,4] Hamming code is partitioned into 4 packets ($s_0$, $s_1$), ($s_2$, $s_3$), ($b_0$, $b_1$) and ($b_2$, $b_3$) with the following distribution of 2 bit "lit" packets:

1 word with 0 lit packet out of 4 (the zero word),
12 words with 3 lit packets out of 4 i.e. 75% of the code's words,
3 words with 4 lit packets out of 4 i.e. 18.75% of the code's words.

With this local property of "(at least) 3 lit packets out of 4", it is possible to impose that, globally, the Tanner graph of the concatenated code cannot contain sub-graphs of non-zero states with a too small size, and therefore to obtain proper minimum distances.

The 6 non-punctured sections derived from section H are called H, H, H, H, H; H and their information bits ($x_0$, $x_1$) and redundancy bits ($y_0$, $y_1$) respectively correspond to bits ($b_0$, $b_1$, $b_2$, $b_3$) such as:

H; ($y_0$, $y_1$, $x_0$, $x_1$)→($b_0$, $b_1$, $b_2$, $b_3$)
H; ($x_0$, $x_1$, $y_0$, $y_1$)→($b_0$, $b_1$, $b_2$, $b_3$)
H; ($x_0$, $y_o$, $y_1$, $x_1$)→($b_0$, $b_1$, $b_2$, $b_3$)
H; ($y_0$, $x_0$, $x_1$, $y_i$)→($b_0$, $b_1$, $b_2$, $b_3$)
H; ($y_0$, $x_0$, $y_1$, $x_1$)→($b_0$, $b_1$, $b_2$, $b_3$)
H; ($x_0$, $y_0$, $x_1$, $y_1$)→($b_0$, $b_1$, $b_2$, $b_3$)

Using a label bit either as an input (information bit) or an output (redundancy bit) in section H completely changes the Boolean function. A large variety of trellis choices (and therefore codes) is thereby obtained, a trellis corresponding to a sequence of sections, as illustrated by FIG. 2.

Figure 2:
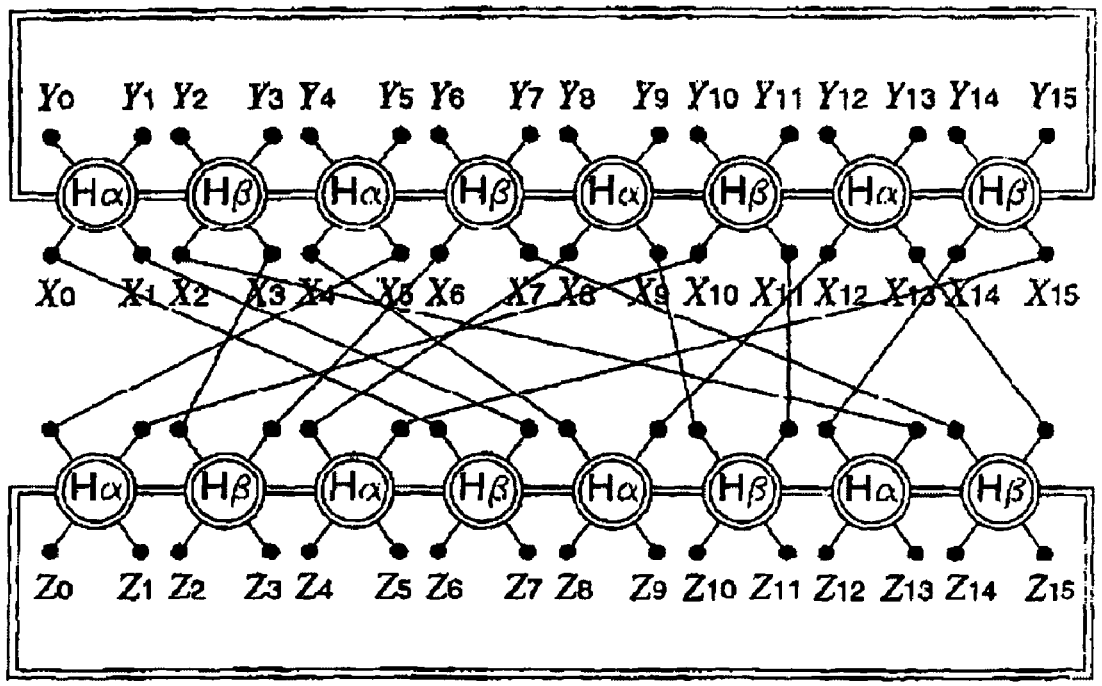
FIG. 2 is an example of parallel turbo-code built by the section according to FIG. 1.

FIG. 2 actually gives an exemplary parallel "turbo-code" with 1 permutation comprising two "tailbiting" cyclic trellises built with the sections listed above.

b) 4 State Punctured Basic Trellis Sections for Binary "Turbo-codes"

Punctured basic sections may be used.

Punctured basic sections are also built by starting with basic section H by puncturing two bits on the left or on the right for example, on all the previous nonpunctured sections and they are noted as $H^g$ and $H^d$ for the basic section:

$H^g$: (*,*, $x_0$, $x_1$)→(*,*, $b_2$, $b_3$)
$H^d$: ($x_0$, $x_1$, *,*)→($b_0$, $b_1$, *,*)

The punctured (removed) bits are indicated by stars *. The other derived and punctured sections previously written are noted as $H^g_a$ and $H^d_a$ with a∈{$H^g$, H, $H^g$, Hd, H, $H^d$}.

Figure 3:
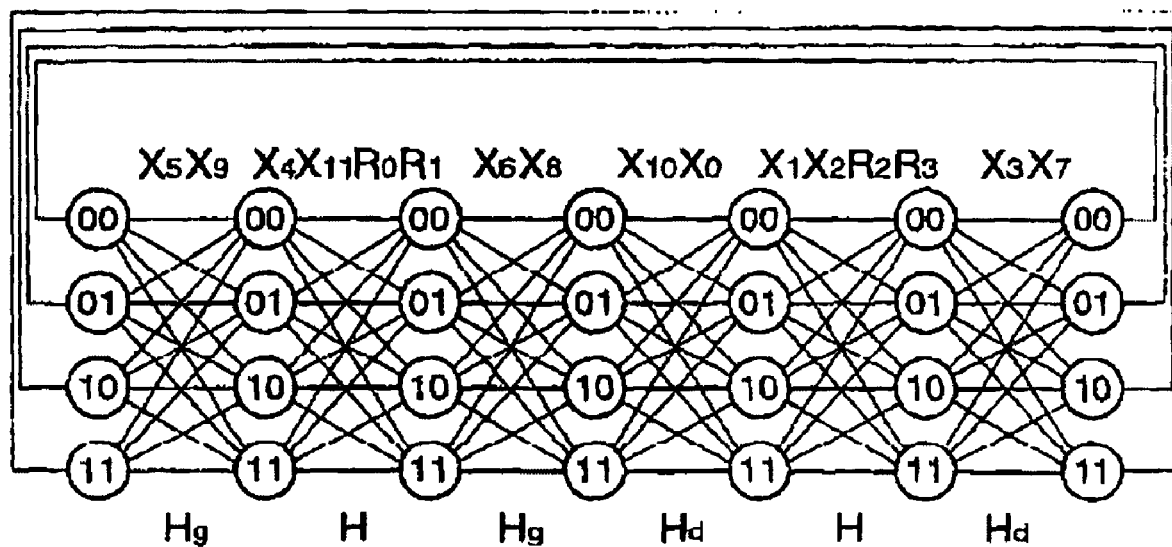
FIG. 3 is another trellis example built by the section of FIG. 1.

FIG. 3 shows an exemplary cyclic trellis using such sections and corresponding to the code with parameters C[16, 12,2]. It consists of the sequence ($H^g$, H, $H^g$, $H^d$, H, $H^d$) on which the 12 information bits Xi, (i=0,1, . . . 11) are matched with 4 redundancy bits $R_j$ (j=0,1, . . . , 3) of the codes with parameters C[16,12,2].

Figure 4:
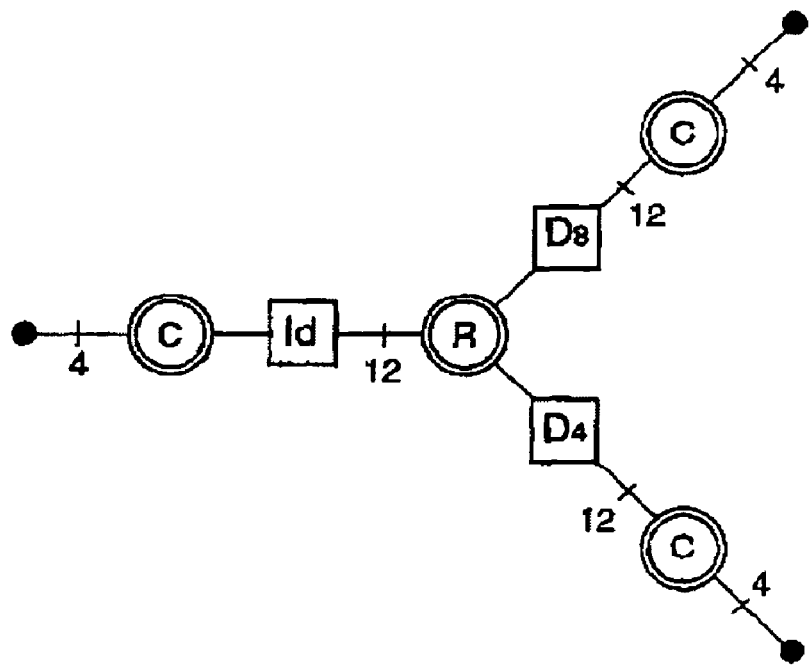
FIG. 4 shows a parallel turbo-code with three permutations using a code according to the trellis of FIG. 3.
Figure 5A:
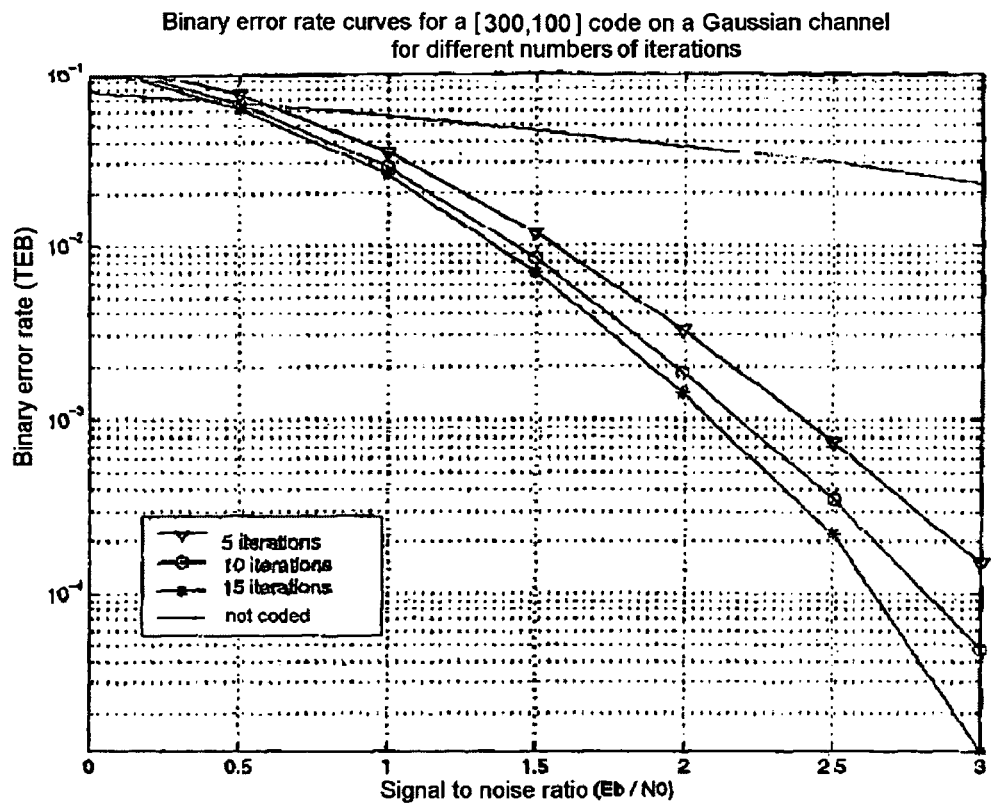
FIGS. 5a-5e are binary error rate curves for different types of codes and different numbers of iterations.
Figure 5B:
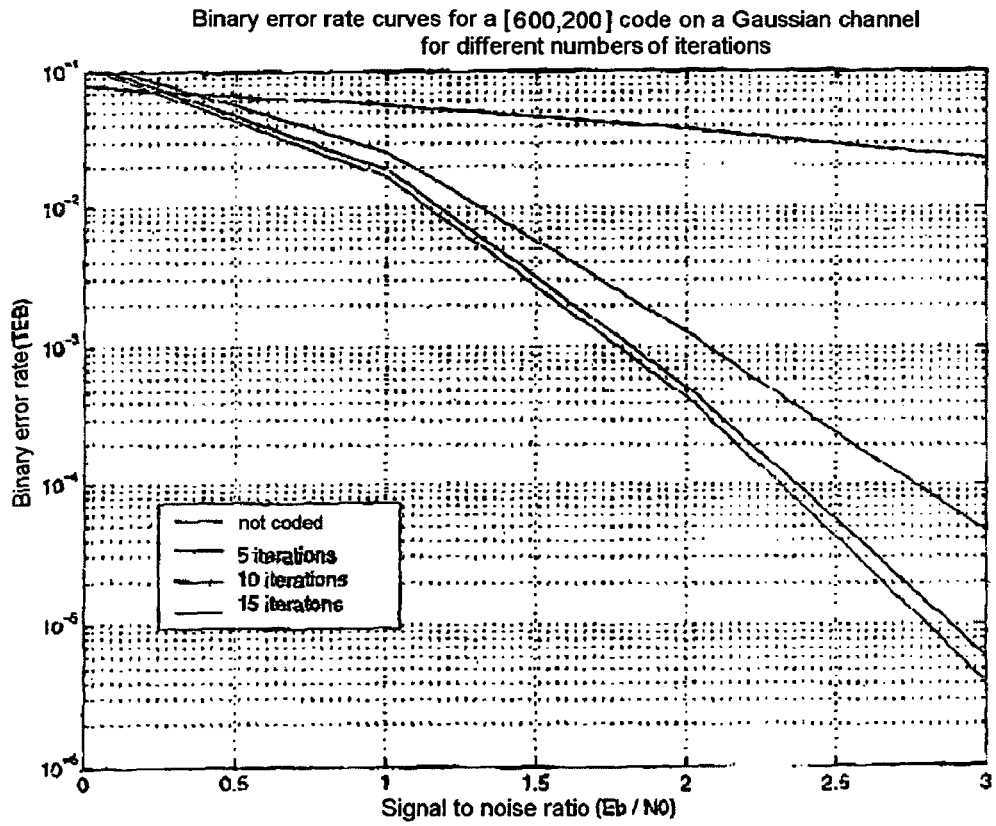
Figure 5C:
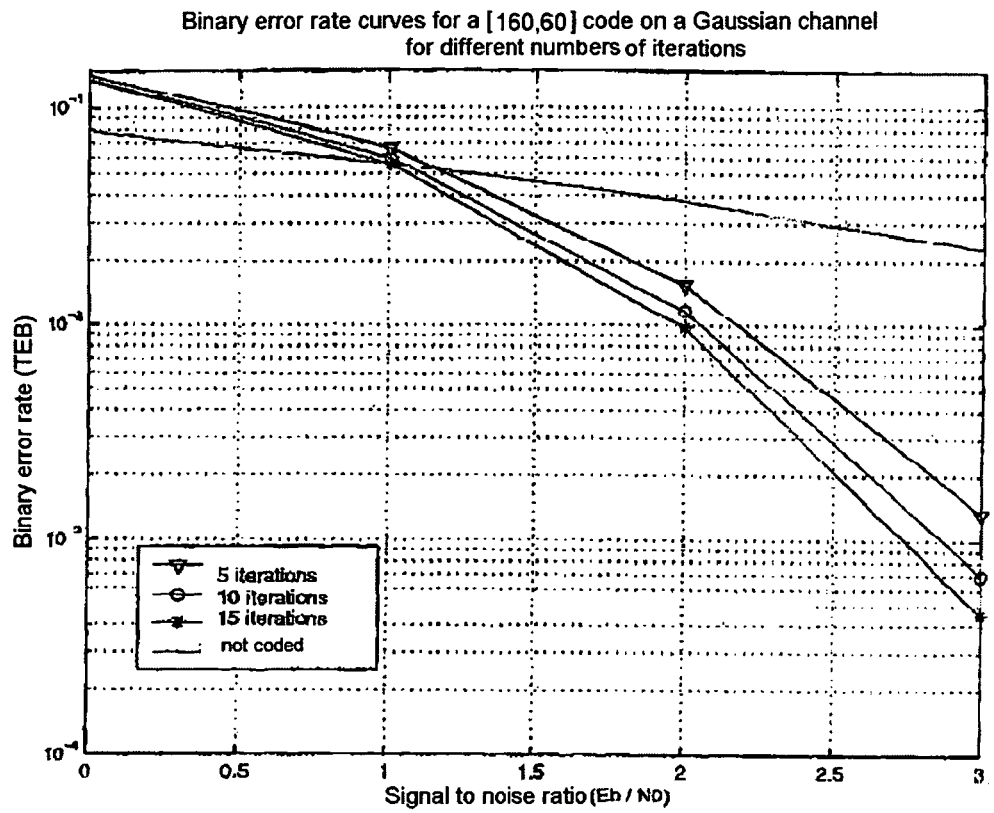
Figure 5D:
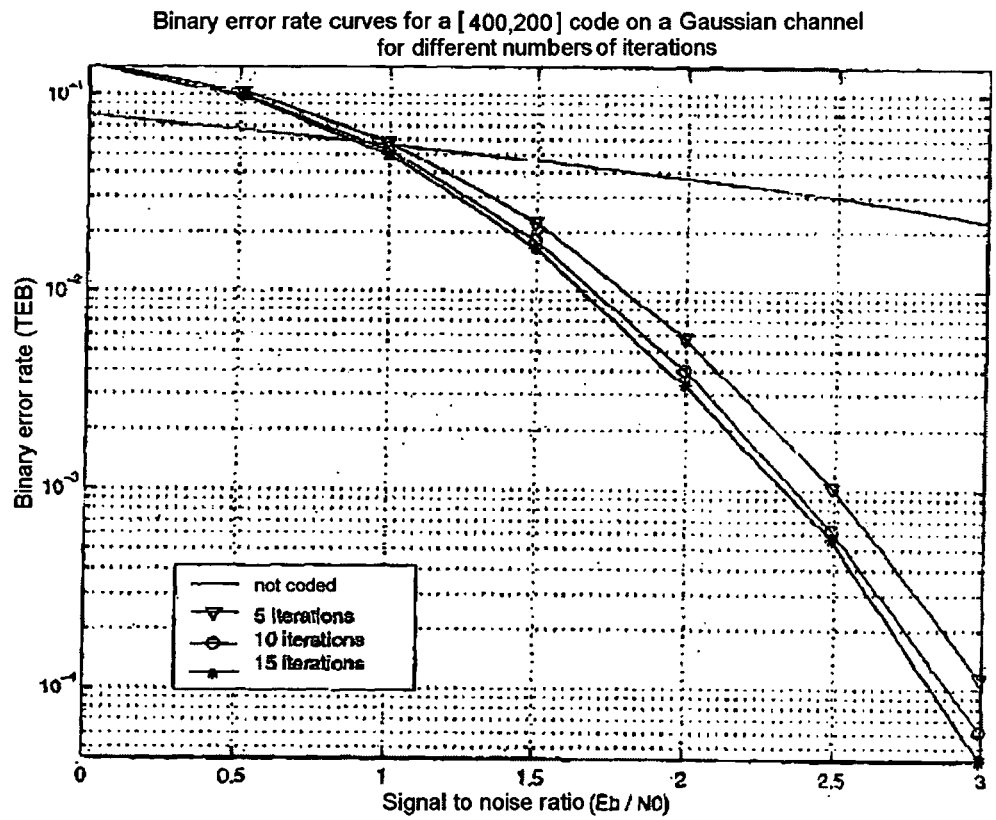

FIG. 4 below shows a (triple) example of use of the trellis of FIG. 3, and therefore of the previous code C[16,12,2] by putting 3 trellises in parallel, each receiving 12 information bits placed at the center of the star.

Block R represents the triply repeated code of the 12-bit information vector.

Permutations in this particular case are very simple: this is the identity permutation noted as Id corresponding to the sequence (X5, X9, X4, X1, X6, X8, X10, X0, X1, X2, X3, X7), and cyclic shift permutations of 4 bits and 8 bits respectively, noted as $D_4$ and $D_8$ delivering sequences circularly shifted by 4 places and 8 places with respect to the identity sequence.

The "turbo-codes" which may be built with such sequences and such component trellises are very diverse: series "turbo-codes", parallel "turbo-codes", hybrid series-parallel "turbo-codes", "Repeat-Accumulate" codes, . . .

c) Description of the Coding of these "Turbo-codes"

The input data for performing the coding on the example of FIG. 2 are information bits ($x_0$, $x_1$, . . . $x_{15}$) from which redundancy bits ($y_0$, $y_1$, . . . $y_{15}$) and ($z_0$, $z_1$, . . . $z_{15}$) are computed. The information bits placed in this case in the middle of the structure are entered in the natural order on one of the trellises and permutated in the other one.

As there are few starting states (4, 8 or 16) for each cyclic trellis, a simple coding way is to arbitrarily select a section as starting section and to compute and store the redundancy bits y and the arrival state (s2,s3) for the label bits x and for each possible starting state (s0,s1).

As an example, for each of the 4 starting states {00,01,10, 11} and for the 2 information bits ($x_0$, $x_1$) of the starting section, the next state is computed (read) by using the trellis section as a logical table.

One starts again with the next section until returning to the input of the starting section as the trellis is cyclic ("tail-biting"): a code word is a simple circuit consisting of a branch in each section of the trellis and therefore having the same starting and arrival state.

Therefore, the only retained coding result is the one which has its arrival state equal to its starting state. The result of the coding is the set of information and redundancy bits, which one may choose to transmit or not according to a possible puncturing before transmission.

Of course, with the previously described algorithm, the code-generating matrix may be calculated once and for all and be used for producing the coding by vector matrix multiplication, but this will be more costly in the amount of computation.

d) Description of the Iterative Decoding of these "Turbo-codes"

The iterative "soft" decoding may be supported on the now standard decoding of the "turbo-codes", from information a priori available on the information and redundancy bits upon reception at the output of the demodulator.

These bits are illustrated by black dots in the Tanner graph as the one of FIG. 2. On each trellis, the a posteriori probabilities are computed from available a priori probabilities according to the BCJR algorithm, or one of its variants, with metrics (SISO, SOVA, SUBMAP . . . ), in order to extract so-called "extrinsic" pieces of information which are injected into the trellis or the other trellises. This process is iterated until stability or after a fixed number of iterations.

FIGS. 5a-5e show a few binary error rate curves (TEB versus the useful signal/noise ratio Eb/N0) resulting from this algorithm, for a few codes with lengths and yields of ½ and ⅓ simulated on a Gaussian channel and 2 state phase modulation "MDP2".

Figure 6:
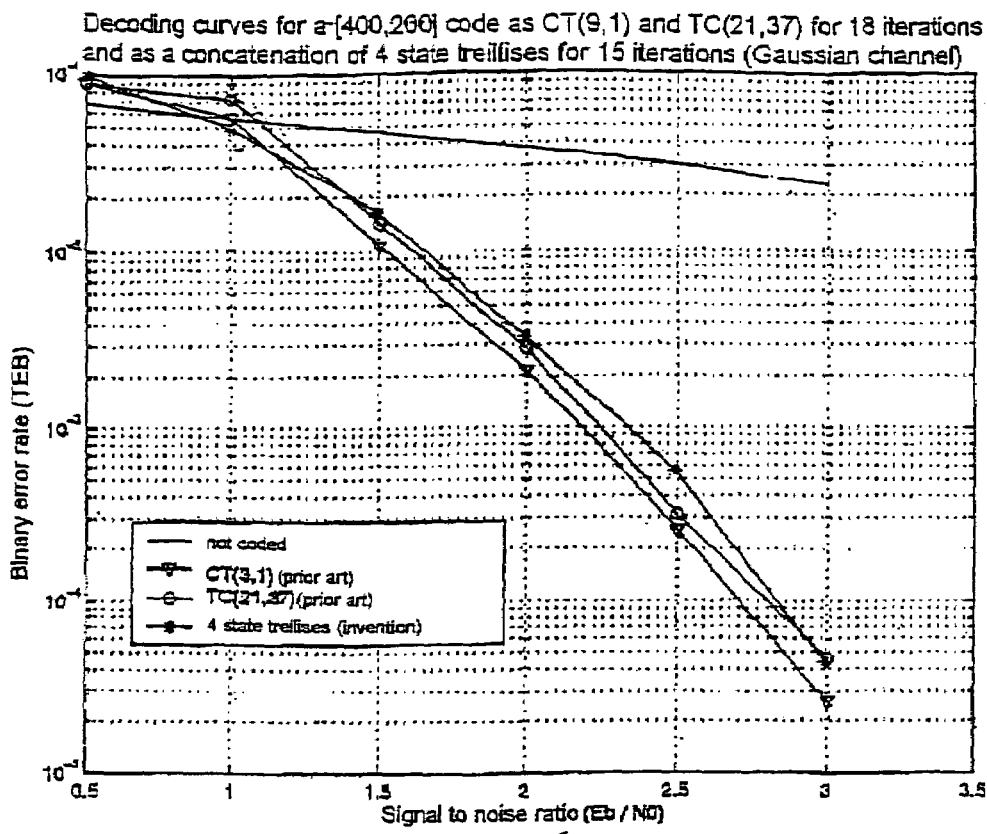
FIG. 6 is a comparison of the decoding results from the technique of the invention with three other techniques from the prior art.
Figure 5E:
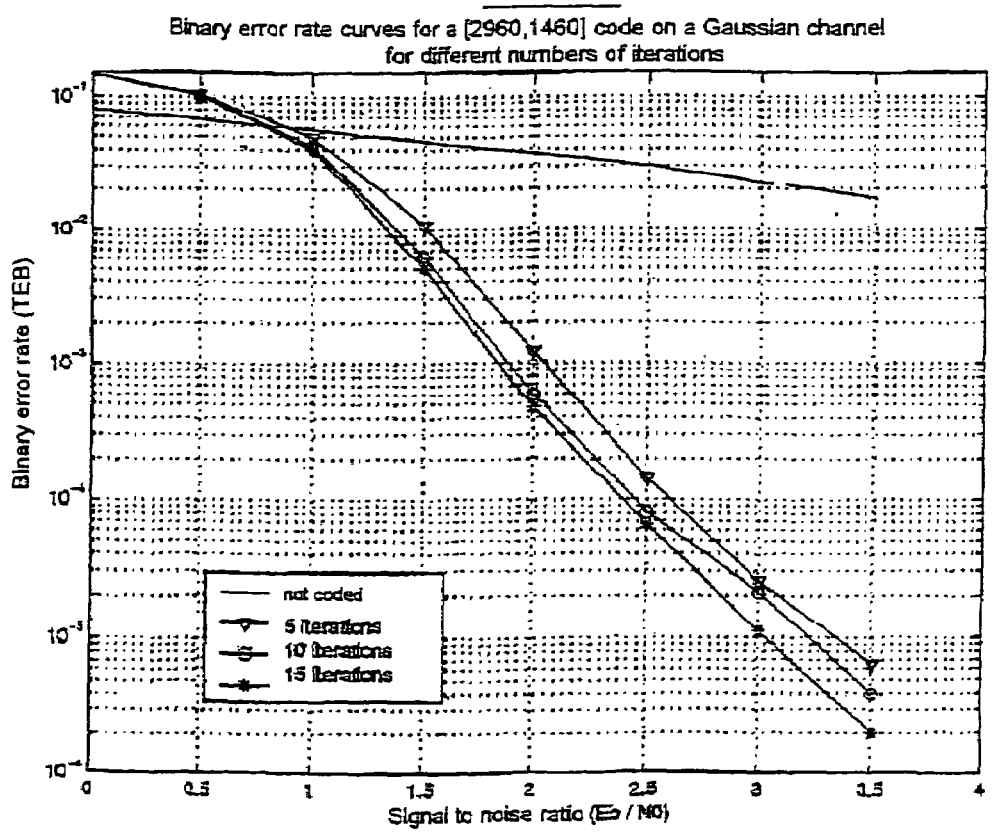

FIG. 6 is a comparison curve in terms of the TEBs of codes of length 400 coding 200 bits of useful information, according to the prior art with 16 state trellises (or an equivalent complexity) and first (not yet optimized) results of a code according to the invention for these lengths.

For about twice less complexity, it is seen that comparable performances are already obtained without optimizing the permutations and structures.

The curves respectively noted as CT(3,1) and TC(21,37) correspond to the prior Li-Ping "turbo-codes" built with 3 tree codes and to the Berrou "turbo-codes" with 16 state binary trellises, respectively.

It is seen that 4 state "turbo-codes" built according to the invention improve for a signal-to-noise ratio Eb/N0 significantly above 3.5 dB (outside the curve).

However, these novel "turbo-codes" have not yet been optimized according to their permutations and their structures whereas those of the prior art have been optimized at great length.

In the example shown, the structure of the new trellises used is indeed not optimized and invariant, as it consists uniquely of sections H. A variety of types of sections in each trellis will enable an increase in the correction capabilities and therefore an improvement of the TEB curves.

3) 16 State Basic Trellis Sections for "Turbo-codes" on $Z_4$

The basic trellis section "N" "on $Z_4$" describes the set of code words with its symbols taken within the ring of integers modulo 4, $Z_4$={0,1,2,3}, equivalent to the Robinson-Nordstrom code with parameters N[8,4,6] having a generating matrix $G_N$ such that:

$$G_N = [1_4 P_N] = \begin{bmatrix} 1 & 0 & 0 & 0 & 2 & 1 & 1 & 1 \\ 0 & 1 & 0 & 0 & 3 & 3 & 2 & 1 \\ 0 & 0 & 1 & 0 & 3 & 1 & 3 & 2 \\ 0 & 0 & 0 & 1 & 3 & 2 & 1 & 3 \end{bmatrix}$$

The 4 symbols {0,1,2,3} of $Z_4$ correspond to the following 2 bit Gray mapping:

0↔{0,0}, 1↔{0,1}, 2↔{1,1}, 3↔{1,0}

Figure 7:
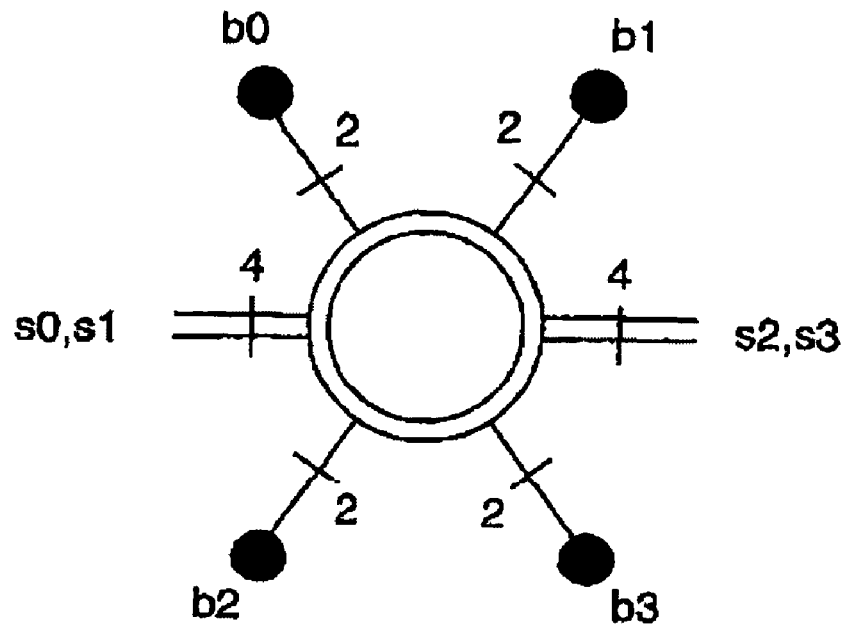
FIG. 7 is a Tanner graph for a 16 state basic section code.

Section N, illustrated in a simplified way in FIG. 7 by its Tanner graph, represents the set of code words of the N[8,4,6] code by a set of paths from the starting state ($s_0$, $s_1$) to the arrival states ($s_2$, $s_3$) via the label branches ($b_0$, $b_1$, $b_2$, $b_3$). The label and state vectors are related by the matrix equation:

$(s_0, s_1, s_2, s_3) = (b_0, b_1, b_2, b_3) P_N$.

The N[8,4,6] code partitioned into 4 packets of 2 symbols on $Z_4$ ($s_0$, $s_1$), ($s_2$, $s_3$), ($b_0$, $b_1$) and ($b_2$, $b_3$), has the following distribution of 2 "lit" symbol packets:

1 word with 0 lit packet out of 4 (the zero word),
60 words with 3 lit packets out of 4 i.e. about 23% of the code's words,
195 words with 4 lit packets out of 4 i.e. 76% of the code's words.

It is noted that the property "at least 3 out of 4" is even more emphasized with the N[8,4,6] code on $Z_4$ with respect to the Hamming [8,4,4] binary code. It is therefore quite interesting to use trellises built with this 16 state basic section since the 2 state symbols on $Z_4$ are each coded with 2 bits.

The same patterns for puncturing and ordering the symbols on the labels of the basic block may be used in order to obtain all the derived sections like for the sections derived from H previously shown.

4) 64 State Basic Sections for "Turbo-codes" on $Z_8$

Section "M" of the basic trellis "on $Z_8$" describes the set of code words with symbols taken in the ring of integers modulo 8, $Z_8$={0,1, . . . ,7}, with a generating matrix $G_M$ such that:

$$G_M = [1_4 P_M] = \begin{bmatrix} 1 & 0 & 0 & 0 & 1 & 5 & 7 & 4 \\ 0 & 1 & 0 & 0 & 4 & 1 & 5 & 7 \\ 0 & 0 & 1 & 0 & 7 & 4 & 1 & 5 \\ 0 & 0 & 0 & 1 & 5 & 7 & 4 & 1 \end{bmatrix}$$

Symbols {0,1, . . . ,7} of $Z_8$ correspond to the standard binary coding of integers of 3 bits:

0↔{0,0,0}, 1↔{0,0,1}, 2↔{0,1,0}, 3↔{0,1,1}, 4↔{1,0,0}, 5↔{1,0,1}, 6↔{1,1,0}, 7↔{1,1,1}.

Figure 8:
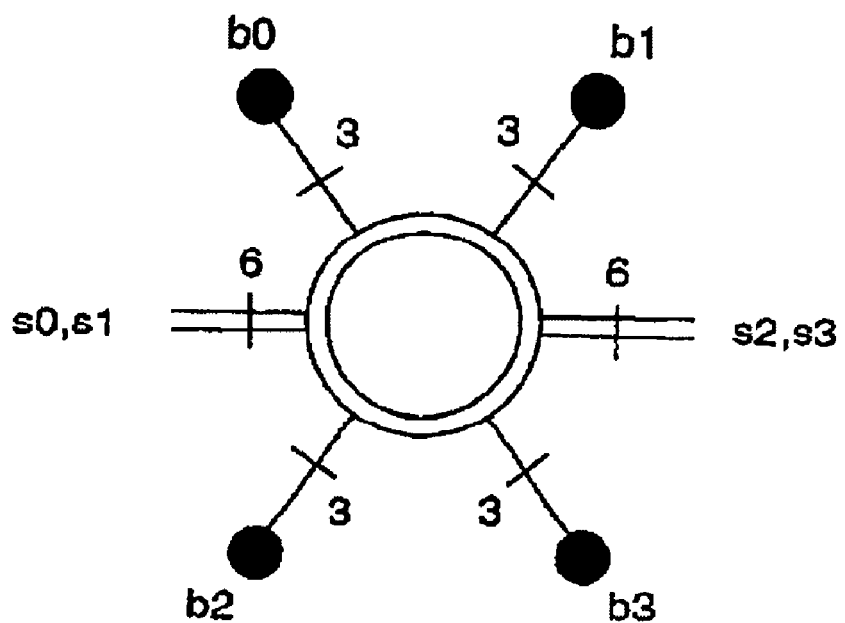
FIG. 8 shows a Tanner graph for a 64 state basic section code.

Section M, illustrated in a simplified way in FIG. 8 by its Tanner graph, represents the set of code words of the M[8,4] code by a set of paths from the starting state ($s_0$, $s_1$) to the arrival states ($s_2$, $s_3$) via the label branches ($b_0$, $b_1$, $b_2$, $b_3$). The state and label vectors are related by the matrix equation:

$(s_0, s_1, s_2, s_3) = (b_0, b_1, b_2, b_3) P_M$.

The M[8,4] code partitioned into 4 packets of 2 symbols on $Z_8$, $(s_0, s_1)$, $(s_2, s_3)$, $(b_0, b_1)$ and $(b_2, b_3)$, has the following distribution of packets of 2 "lit" symbols:

1 word with 0 lit packet out of 4 (the zero word),
252 words with 3 lit packets out of 4 i.e. about 6% of the code's words,
3443 words with 4 lit packets out of 4 i.e. 94% of the code(s words.

It is noted that the property "at least 3 out of 4" is even more emphasized with this M[8,4] code on $Z_8$ with respect to the quaternary N[8,4,6] code and the Hamming [8,4,4] binary code.

Of course, other codes [8,4] may be found which have the same property of "at least 3 out of 4" which is essential during the concatenation of trellis stages and the use of the trellises for building large codes, efficiently.

Therefore, it is quite interesting to use trellises built with this 64 state basic section since the 2 state symbols on $Z_8$ are each coded with 3 bits.

The same patterns for puncturing and ordering the symbols on the labels of the basic block may be used for obtaining all the derived sections, like the sections derived from sections N and H previously shown.

Although the present invention has been described with reference to preferred embodiments, workers skilled in the art will recognize that changes may be made in form and detail without departing from the spirit and scope of the invention.

What is claimed is:

1. An error correction coding method, comprising the steps of:
providing for at least two distinct sections of a predetermined elementary code, each section associating an arrival vector $(s_2, s_3)$ with a starting state vector $(s_0, s_1)$ according to a vector of branch labels $(b_0, b_1, b_2, b_3)$ defining a code word, two sections of said elementary code being distinct when the order and/or the role of the elements of said branch label vector are changed;
associating said sections to define a correction code;
generating coded data, by coding source data according to said correction code; and
transmitting the coded data to a transmission channel.

2. The coding method according to claim 1, wherein said step of providing comprises a step of partitioning the code words of said elementary code into four packets $(s_0, s_1)$, $(s_2, s_3)$, $(b_0, b_1)$, $(b_2, b_3)$ such that each code word, except the zero code word, comprises at least three lit packets out of four, wherein a packet is said to be lit when it comprises at least a bit of value 1.

3. The coding method according to claim 1, wherein said step of associating provides for an association in sequence of said elementary code sections, in order to form at least one coding trellis.

4. The coding method according to claim 3, wherein said at least one coding trellis is cyclic.

5. The coding method according to claim 4, wherein said step of generating comprises a step of selecting a retained coding result, which is the coding result that has an arrival state identical with its starting state, among all the possible starting states for one of said elementary code sections, selected as started section.

6. The coding method according to claim 5, wherein said step of selecting selects a set of information and redundancy elements delivered by said at least one trellis.

7. The coding method according to claim 6, wherein said step of generating comprises a step of puncturing applied on said elements forming the retained coding result.

8. The coding method according to claim 3, wherein said step of associating provides for two trellises, wherein the source data to be coded are entered in different orders.

9. The coding method according to claim 3, wherein said step of associating provides for at least two duplicated trellises in order to provide at least two coding sets interconnected via permutation means.

10. The coding method according to claim 9, wherein the method comprises a step of shifting the data to be coded and a step of transmitting the shifted data to each of said coding sets.

11. The coding method according to claim 9, wherein said step of providing provides for three coding sets each receiving 12 coding bits via an identity permutation, a 4 bit cyclic shift permutation and a 8 bit cyclic shift permutation, respectively.

12. The coding method according to claim 11, wherein said step of providing organizes said coding sets in order to produce a Golay [24,12,8] code.

13. The coding method according to claim 1, comprising a step of puncturing at least one of said sections.

14. The coding method according to claim 13, wherein said step of puncturing delivers at least one left punctured section and at least one right punctured section.

15. The coding method according to claim 14, wherein said step of providing applies the following punctured sections:
$H^g$; (*,*, $x_0$, $x_1$) (*,*, $b_2$, $b_3$)
$H^d$; ($x_0$, $x_1$, *,*), ($b_0$, $b_1$, *,*).

16. The coding method according to claim 1, wherein said vectors comprise binary elements.

17. The coding method according to claim 16, wherein said elementary code is a Hamming [8,4,4] code.

18. The coding method according to claim 17, wherein said step of providing applies the following sections:
H; ($y_0$, $y_1$, $x_0$, $x_1$) ($b_0$, $b_1$, $b_2$, $b_3$)
H; ($x_0$, $x_1$, $y_0$, $y_1$) ($b_0$, $b_1$, $b_2$, $b_3$)
H; ($x_0$, $y_0$, $y_1$, $x_1$) ($b_0$, $b_1$, $b_2$, $b_3$)
H; ($y_0$, $x_0$, $x_1$, $y_1$) ($b_0$, $b_1$, $b_2$, $b_3$)
H; ($y_0$, $x_0$, $y_1$, $x_1$) ($b_0$, $b_1$, $b_2$, $b_3$)
H; ($x_0$, $y_0$, $x_1$, $y_1$) ($b_0$, $b_1$, $b_2$, $b_3$).

19. The coding method according to claim 1, characterized wherein said step of providing provides for vectors comprising basic words which may assume 4 values.

20. The coding method according to claim 19, wherein said elementary code is a Nordstrom-Robinson code with parameters [8,4,6].

21. The coding method according to claim 1, wherein said step of providing provides for vectors comprising basic words which may assume 8 values.

22. The coding method according to claim 21, wherein said elementary code is a M[8,4] code.

23. The coding method according to claim 1, wherein it comprises a step of "turbo coding".

24. A method for decoding comprising the steps of:
receiving coded data from a transmission channel;
providing for at least two distinct sections of a predetermined elementary code, each section associating an arrival vector $(s_2, s_3)$ with a starting state vector $(s_0, s_1)$ according to a vector of branch labels $(b_0, b_1, b_2, b_3)$ defining a code word, two sections of said elementary code being distinct when the order and/or the role of the elements of said branch label vector are changed;
associating said sections to define a correction code;
decoding the coded data according to said correction code; and
outputting the decoded data.

25. The decoding method according to claim 24, wherein said step of decoding is iterative.

26. The decoding method according to claim 25, wherein each iteration provides for a step of computing a posteriori probabilities on metrics associated with at least one trellis defined by said elementary code sections and a step of interrupting said iterations when a stable result is obtained and/or after a predetermined number of iterations.

* * * * *